(12) United States Patent
Bonser et al.

(10) Patent No.: US 6,764,949 B2
(45) Date of Patent: Jul. 20, 2004

(54) METHOD FOR REDUCING PATTERN DEFORMATION AND PHOTORESIST POISONING IN SEMICONDUCTOR DEVICE FABRICATION

(75) Inventors: Douglas J. Bonser, Austin, TX (US);
Marina V. Plat, San Jose, CA (US);
Chih Yuh Yang, San Jose, CA (US);
Scott A. Bell, San Jose, CA (US);
Darin Chan, Campbell, CA (US);
Philip A. Fisher, Foster City, CA (US);
Christopher F. Lyons, Fremont, CA (US); Mark S. Chang, Los Altos, CA (US); Pei-Yuan Gao, San Jose, CA (US); Marilyn I. Wright, Austin, TX (US); Lu You, San Jose, CA (US);
Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/334,392

(22) Filed: Dec. 30, 2002

(65) Prior Publication Data

US 2004/0023475 A1 Feb. 5, 2004

Related U.S. Application Data

(60) Provisional application No. 60/400,453, filed on Jul. 31, 2002.

(51) Int. Cl.$^7$ ........................ H01L 21/44; H01L 21/311
(52) U.S. Cl. ......................................... 438/666; 438/703
(58) Field of Search ................................. 438/585, 666, 438/703, 157; 430/318

(56) References Cited

U.S. PATENT DOCUMENTS

| | | | | |
|---|---|---|---|---|
| 5,356,824 A | * | 10/1994 | Chouan et al. | 438/157 |
| 6,080,529 A | * | 6/2000 | Ye et al. | 430/318 |
| 6,143,476 A | * | 11/2000 | Ye et al. | 430/318 |
| 6,331,380 B1 | * | 12/2001 | Ye et al. | 430/318 |
| 6,458,516 B1 | * | 10/2002 | Ye et al. | 438/703 |
| 6,534,403 B2 | * | 3/2003 | Cleeves | 438/666 |
| 6,664,639 B2 | * | 12/2003 | Cleeves | 257/774 |

* cited by examiner

Primary Examiner—John F. Niebling
Assistant Examiner—Walter L. Lindsay, Jr.
(74) Attorney, Agent, or Firm—Foley & Lardner LLP

(57) ABSTRACT

A hardmask stack is comprised of alternating layers of doped amorphous carbon and undoped amorphous carbon. The undoped amorphous carbon layers serve as buffer layers that constrain the effects of compressive stress within the doped amorphous carbon layers to prevent delamination. The stack is provided with a top capping layer. The layer beneath the capping layer is preferably undoped amorphous carbon to reduce photoresist poisoning. An alternative hardmask stack is comprised of alternating layers of capping material and amorphous carbon. The amorphous carbon layers may be doped or undoped. The capping material layers serve as buffer layers that constrain the effects of compressive stress within the amorphous carbon layers to prevent delamination. The top layer of the stack is formed of a capping material. The layer beneath the top layer is preferably undoped amorphous carbon to reduce photoresist poisoning. The lowest layer of the hardmask stack is preferably amorphous carbon to facilitate easy removal of the hardmask stack from underlying materials by an ashing process.

18 Claims, 5 Drawing Sheets

METHOD FOR REDUCING PATTERN DEFORMATION AND PHOTORESIST POISONING IN SEMICONDUCTOR DEVICE FABRICATION

RELATED APPLICATIONS

This application claims priority under 35 U.S.C. § 119(e) from U.S. Provisional Patent Application Serial No. 60/400,453, filed Jul. 31, 2002.

BACKGROUND OF THE INVENTION

1. Field of the Invention

Embodiments of the invention relate to semiconductor fabrication, and in particular, to methods of eliminating pattern deformation in semiconductor devices.

2. Related Art

The use of amorphous carbon film as part of a hardmask stack for patterning MOSFET features has been found to be beneficial due to the ease with which amorphous carbon may be patterned and the high selectivity of amorphous carbon relative to typically used capping or protective materials such as silicon oxide, silicon nitride and silicon oxynitride. FIG. 1 shows a structure including amorphous carbon that may be used in the formation of a MOSFET. The structure includes a semiconductor substrate 2 having field oxides 4 that bound source/drain regions of a MOSFET. A layer of a gate insulating material 6 such as $SiO_2$ is formed over the substrate. A layer of a gate conductive material 8 such as doped polysilicon is formed over the substrate and will be patterned to form a gate line of the MOSFET. Formed over the gate conductive layer 8 is a hardmask stack including an amorphous carbon layer 10 and a capping material layer 12 such as SiON. A photoresist mask 14 for defining the pattern of the gate is formed on the SiON capping material layer 12. During processing, a first etch is used to transfer the photoresist mask pattern to the SiON layer, a second etch is used to transfer the SiON mask pattern to the amorphous carbon layer, a third etch is used to remove oxide from the surface of the gate conductive layer, and a further etches are performed to etch the underlying gate conductive layer using the SiON and amorphous carbon patterns as a hardmask.

One problem with the structure of FIG. 1 is that the amorphous carbon material has relatively poor selectivity with respect to the polysilicon gate conductive material during the polysilicon etch, and as a result the amorphous carbon is also etched during etching of the polysilicon, resulting in degradation of the transferred pattern. A proposed solution to this problem is to dope the amorphous carbon with nitrogen, which enhances its selectivity with respect to polysilicon.

However, the nitrogen doping technique creates other problems that become more significant as device dimensions are reduced. One problem involves poisoning of the photoresist with nitrogen from the amorphous carbon layer. Poisoning is enabled by pinholes in the SiON cap layer that randomly occur during SiON deposition. The pinholes extend partly or entirely through the SiON layer, enabling nitrogen dopant from the amorphous carbon to diffuse into the photoresist. Poisoned photoresist is difficult to remove by conventional developing techniques and therefore the poisoned photoresist degrades the quality of the photoresist mask. As SiON cap layers become thinner, the poisoning problem becomes more pronounced.

A second problem of amorphous carbon is delamination of etched amorphous carbon from the underlying polysilicon. FIGS. 2a and 2b illustrate this problem. FIG. 2a shows a top view of a patterned amorphous carbon line. The line is subject to compressive forces 16 resulting from differences in the thermal expansion coefficients of amorphous carbon, polysilicon and SiON. As the width of the line decreases relative to its length, the compressive forces along the length of the line become significantly greater than those across the width of the line. So long as a SiON top layer is present on the amorphous carbon line, the compressive forces do not deform the line. However, during typical processing, an etch for removing oxide from the polysilicon layer is performed after patterning the amorphous carbon, and this etch typically removes most or all of the SiON overlying the amorphous carbon line. At that point the internal compressive forces of the amorphous carbon are no longer restrained, and the amorphous carbon delaminates from the underlying polysilicon and may assume a "squiggle" pattern as shown in FIG. 2b that effectively lengthens the line to relieve compressive stress. This pattern will be reproduced in the polysilicon upon further etching, resulting in a deformed gate line. The severity of this problem is enhanced by nitrogen doping.

Consequently, there is a need for methods that reduce pattern deformation and photoresist poisoning while maintaining the desirable etch selectivity properties of nitrogen doped amorphous carbon.

SUMMARY OF THE DISCLOSURE

It is an object of the present invention to reduce pattern deformation in semiconductor device fabrication.

In accordance with one preferred embodiment of the invention, a hardmask stack is comprised of alternating layers of doped amorphous carbon and undoped amorphous carbon. The undoped amorphous carbon layers serve as buffer layers that constrain the effects of compressive stress within the doped amorphous carbon layers to prevent delamination. The stack is provided with a top capping material layer. The layer beneath the capping material layer is preferably undoped amorphous carbon to reduce photoresist poisoning.

In accordance with a second preferred embodiment, a hardmask stack is comprised of alternating layers of a capping material and amorphous carbon. The amorphous carbon layers may be doped or undoped. The capping material layers serve as buffer layers that constrain the effects of compressive stress within the amorphous carbon layers to prevent delamination. The top layer of the stack is formed of the capping material. The layer beneath the capping layer is preferably undoped amorphous carbon to reduce photoresist poisoning. The lowest layer of the hardmask stack is preferably amorphous carbon to facilitate easy removal of the hardmask stack from the underlying materials by an ashing process.

BRIEF DESCRIPTION OF THE DRAWINGS

Preferred embodiments of the invention will hereafter be described with reference to the accompanying drawings.

DETAILED DESCRIPTION OF PREFERRED EMBODIMENTS

Figure 3A:
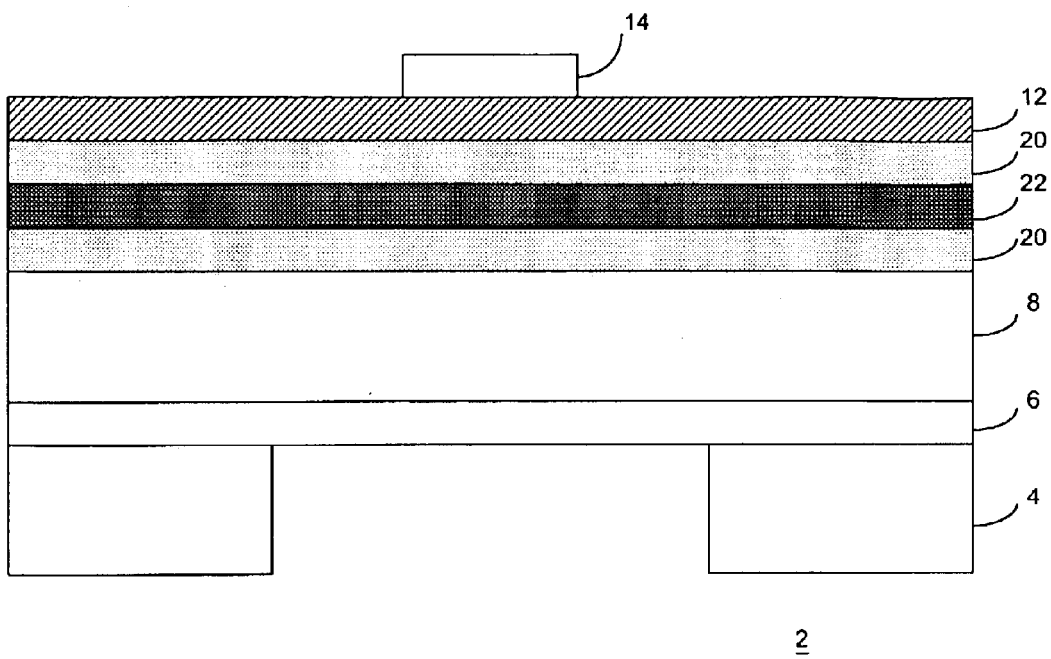
FIGS. 3a and 3b show structures formed during fabrication of a semiconductor device in accordance with a first preferred embodiment of the invention.
Figure 3B:
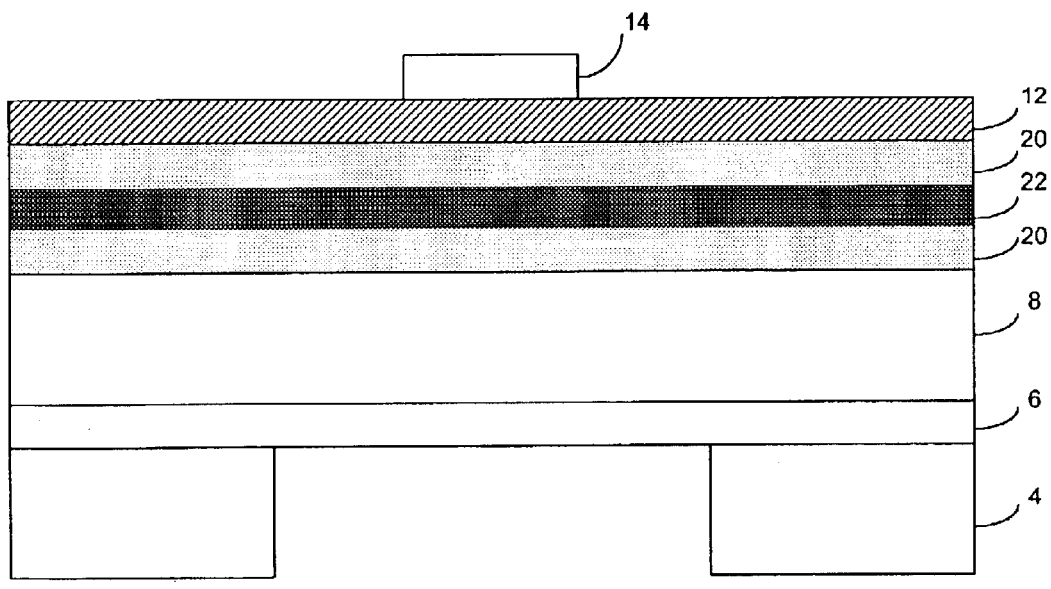

FIGS. 3a and 3b show alternative structure formed in accordance with a first preferred embodiment of the invention.

The structure of FIG. 3a includes a semiconductor substrate 2 having field oxides 4 that bound source/drain regions of a MOSFET. Layers of a gate insulating material 6 such as $SiO_2$ and a gate conductive material 8 such as doped polysilicon are formed over the substrate and will be patterned to form a gate line and gate insulator of the MOSFET. Formed over the gate conductive layer 8 is a hardmask stack including an amorphous carbon portion formed in contact with the underlying polysilicon. The amorphous carbon portion is comprised of discrete alternating layers of doped amorphous carbon 22 containing dopant such as nitrogen for enhancing its etch selectivity relative to the polysilicon, and undoped amorphous carbon 20 that contains essentially none of the etch selectivity enhancing dopant of the doped layers 22. A capping layer 12 of SiON, silicon oxide or silicon nitride is formed over the amorphous carbon portion of the hardmask stack, and a photoresist mask 14 for defining the pattern of the gate line is formed on the capping layer 12. The total height of the hardmask stack is preferably approximately 500 angstroms.

Figure 1:
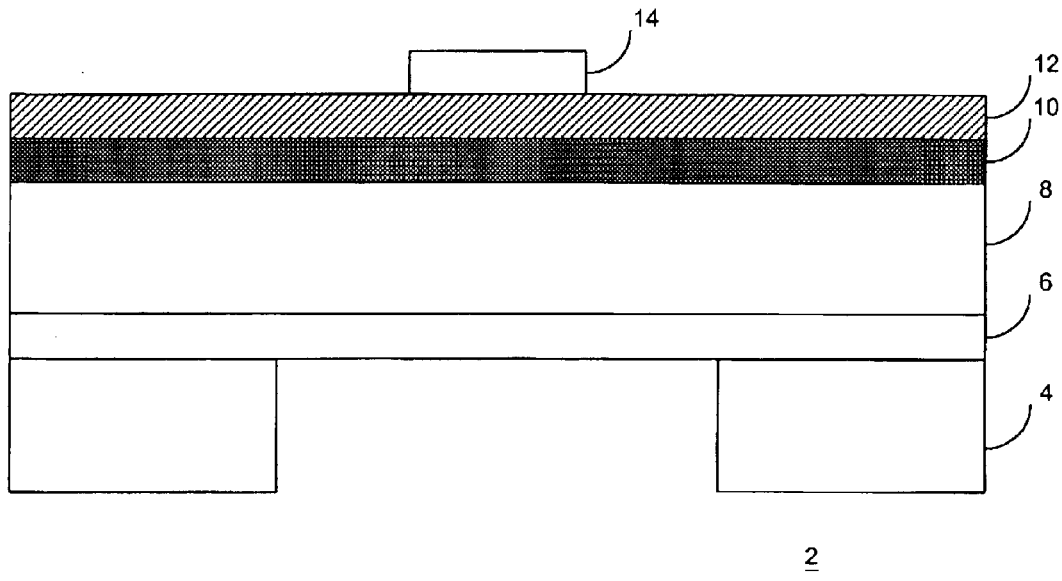
FIG. 1 shows a structure formed during fabrication of a semiconductor device using an amorphous carbon layer.
Figures 2A, 2B:
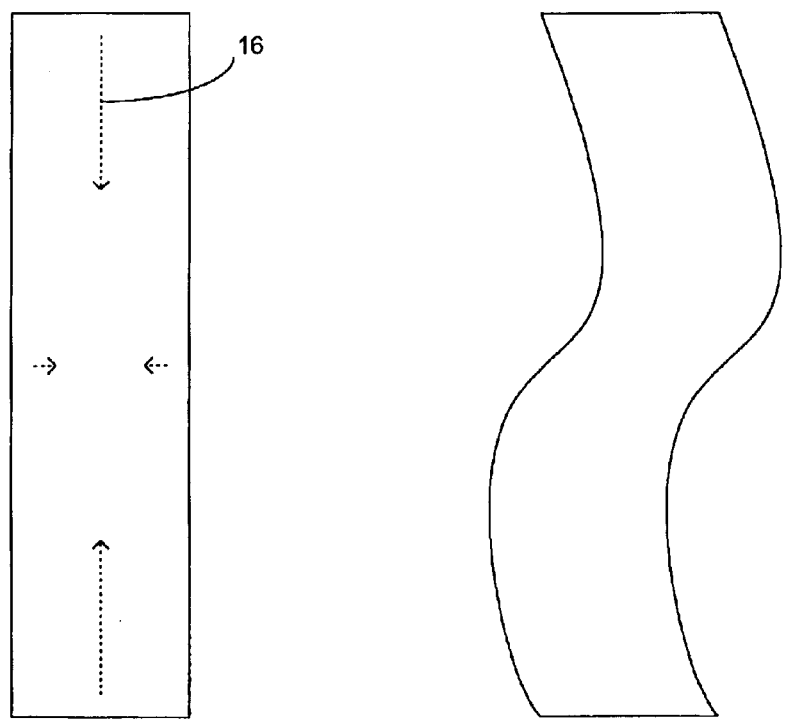
FIGS. 2a and 2b illustrate doped amorphous carbon line deformation.

The structure of FIG. 3a differs from the structure of FIG. 1 in its use of undoped amorphous carbon layers 20 in conjunction with one or more doped amorphous carbon layers 22. The undoped layers 20 serve as buffering layers that constrain the compressive stresses within the doped layers 22 to prevent delamination. While any number and order of doped and undoped layers may be employed in accordance with this embodiment, it is preferred to provide an uppermost layer of undoped amorphous carbon in contact with the capping layer to reduce photoresist poisoning, and to provide a lowermost layer of undoped amorphous carbon formed on the underlying polysilicon layer to increase resistance to delamination.

The layers of the amorphous carbon portion illustrated in FIG. 3a are formed as discrete layers in independent processing steps. In an alternative to the structure of FIG. 3a, the doped and undoped layers may be formed as continuous layers as illustrated in FIG. 3b. This is done by varying dopant source gas flow rates during a single continuous deposition process to produce a dopant profile having a desired gradient through the amorphous carbon portion of the hardmask.

Further alternatives to the structures of FIGS. 3a and 3b may employ a greater number of layers of doped and undoped amorphous carbon, and may arrange those layers in a different order, such as by having a doped layer formed on the underlying polysilicon. In further embodiments, alternative capping materials such as silicon rich oxide, or silicon rich nitride may be employed. In still further embodiments, such hardmask structures may be formed over a different material to be etched, such as a metal wiring layer, or may be used to form a different type of patterned structure, such as a contact or interconnect.

Figure 4:
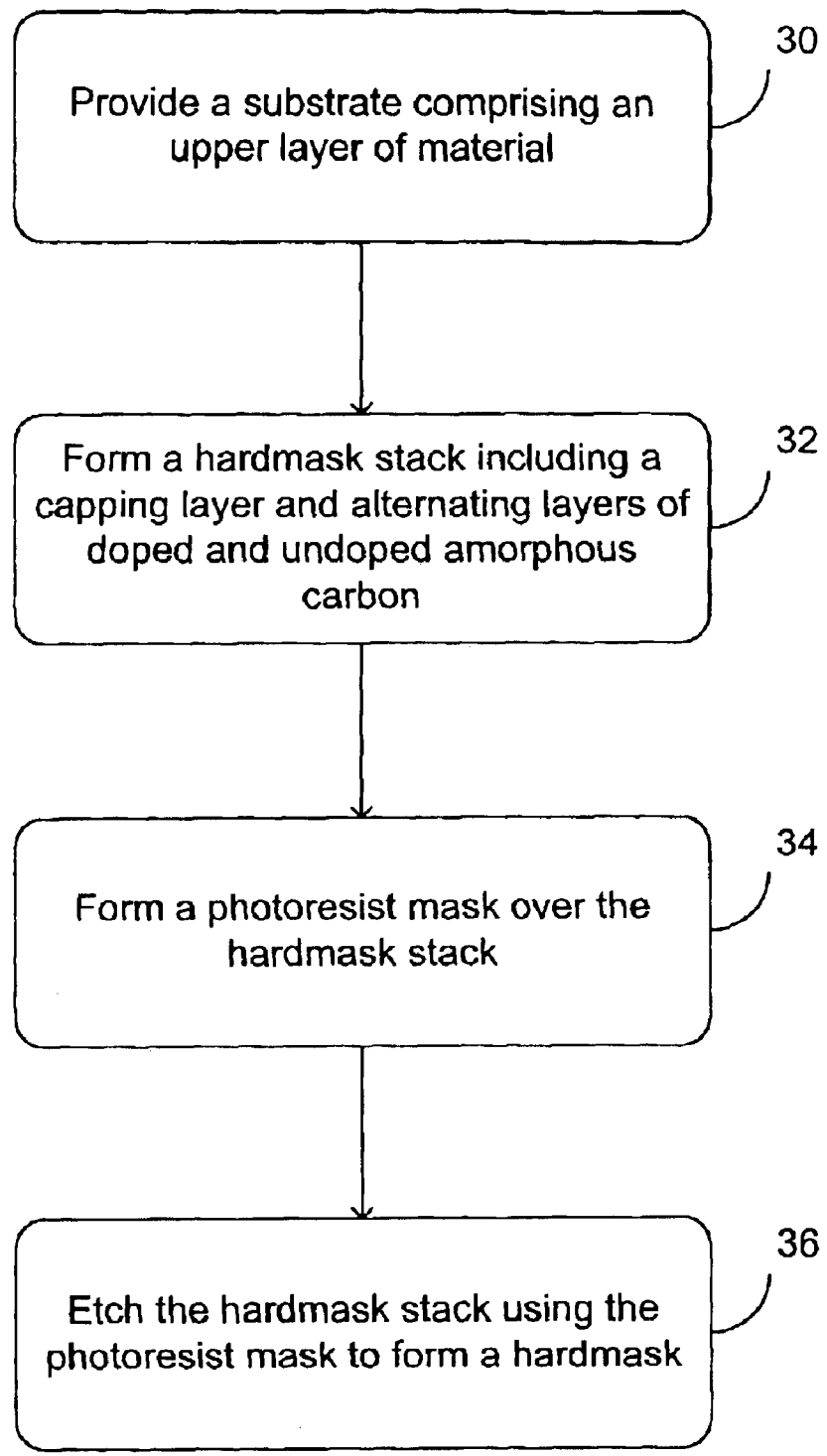
FIG. 4 shows a process flow encompassing the first preferred embodiment and alternative embodiments.

FIG. 4 shows a process flow for manufacture of a semiconductor device encompassing the first preferred embodiment, its aforementioned alternatives, and further alternative embodiments not explicitly discussed. Initially a substrate comprising an upper layer of material is provided (30). A hardmask stack is then formed on the upper layer of material (32). The hardmask stack is comprised of an amorphous carbon portion formed in contact with the layer of material, and a capping layer formed on the amorphous carbon portion. The amorphous carbon portion is comprised of alternating layers of doped amorphous carbon containing dopant for enhancing etch selectivity with respect to the material, and undoped amorphous carbon that contains essentially none of the dopant.

A photoresist mask is then formed over the hardmask (34). The photoresist mask may be trimmed by a photoresist trimming process. The hardmask stack is then etched using the photoresist mask as an initial etch mask to form a hardmask for patterning the underlying material (36).

Further processing may also be performed such as patterning the upper layer of material and removing the hardmask.

Figure 5:
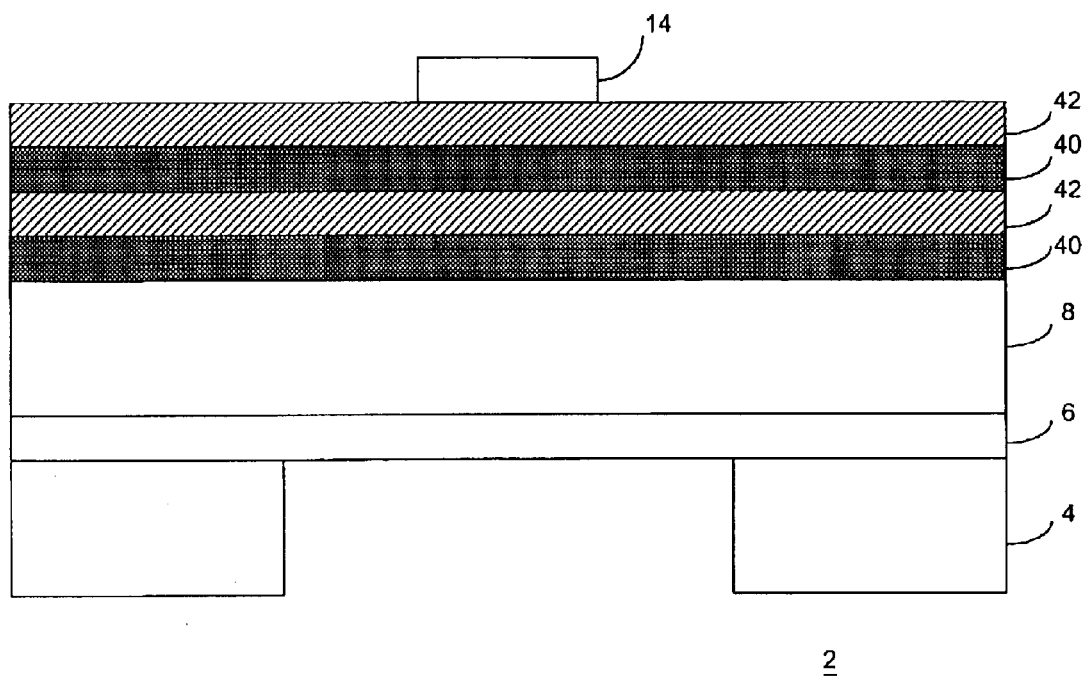
FIG. 5 shows a structure formed during fabrication of a semiconductor device in accordance with a second preferred embodiment of the invention.

FIG. 5 shows a structure formed in accordance with a second preferred embodiment of the invention.

The structure of FIG. 5 includes a semiconductor substrate 2 having field oxides 4 that bound source/drain regions of a MOSFET. Layers of a gate insulating material 6 such as silicon oxide and a gate conductive material 8 such as doped polysilicon are formed over the substrate. The gate conductive layer 8 will be patterned to form a gate line of a MOSFET. Formed over the gate conductive layer 8 is a hardmask stack including alternating layers of amorphous carbon 40 and a layer of a capping material 42 such as silicon oxide, silicon nitride, or silicon oxynitride. The amorphous carbon may be doped or undoped. A photoresist mask 14 for defining the pattern of the gate line is formed on the upper layer of capping material. The total height of the hardmask stack is preferably approximately 500 angstroms. The layers of capping material are preferably 20–50 angstroms in height.

The structure of FIG. 5 differs from the structure of FIG. 1 in its use of multiple alternating layers of amorphous carbon and capping material. The layers of capping material 42 serve as buffering layers that constrain compressive stresses within amorphous carbon layers 40 to prevent delamination. While the uppermost layer of capping material will typically be removed during the course of etching the hardmask, the remaining layer or layers of capping material will remain to resist delamination.

It is preferable to form the lowermost layer of the hardmask stack from amorphous carbon in order to enable removal of the hardmask by an ashing process, and to form the uppermost amorphous carbon layer of the hardmask stack from undoped amorphous carbon to reduce photoresist poisoning. However, in alternative embodiments the lowermost layer may be formed of a capping material, and the uppermost amorphous carbon layer may be doped. In further embodiments, alternative capping materials such as silicon rich oxide, or silicon rich nitride may be employed, and different capping materials may be used in different layers within the same hardmask stack. In still further embodiments, such hardmask structures may be formed over a different material to be etched, such as a metal wiring layer, or may be used to form a different type of patterned structure, such as a contact or interconnect.

Figure 6:
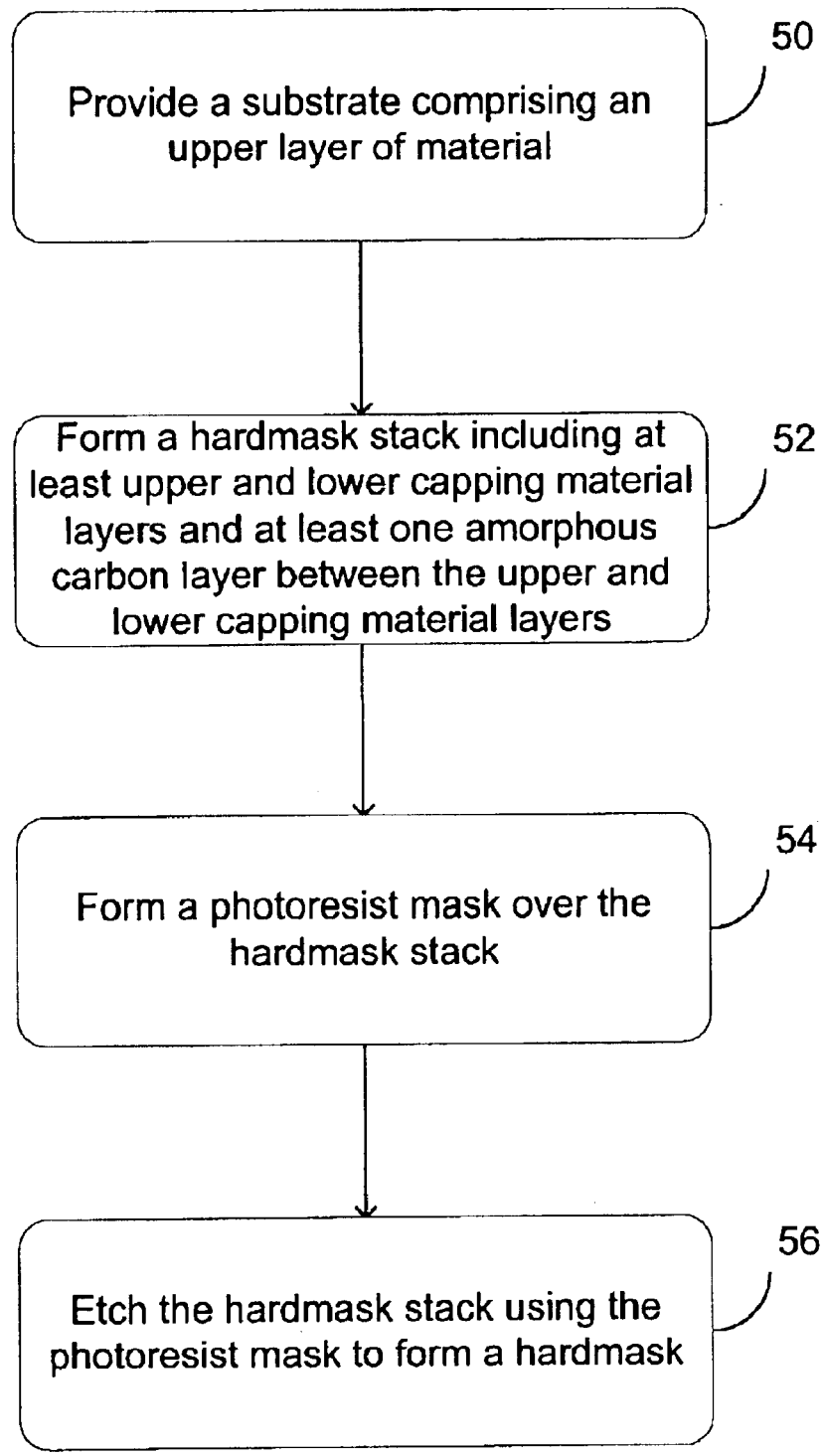
FIG. 6 shows a process flow encompassing the second preferred embodiment and alternative embodiments.

FIG. 6 shows a process flow for manufacture of a semiconductor device encompassing the second preferred embodiment, its aforementioned alternatives, and further alternative embodiments not explicitly discussed. Initially a substrate comprising an upper layer of material is provided (50). A hardmask stack is then formed on the upper layer of material (52). The hardmask stack is comprised of alternating layers of capping material and amorphous carbon including at least a first upper layer of capping material, a layer of amorphous carbon underlying the first upper layer of capping material, and a second layer of capping material underlying the layer of amorphous carbon. A photoresist mask is then formed over the hardmask (54). The photoresist mask may be trimmed by a photoresist trimming process. The hardmask stack is then etched using the photoresist mask as an initial etch mask to form a hardmask for patterning the underlying upper layer of material (56).

Further processing may also be performed such as patterning the underlying material and removing the hardmask.

While the invention has been described with reference to its preferred embodiments, those skilled in the art will understand and appreciate from the foregoing that variations in equipment, operating conditions and configuration may be made and still fall within the spirit and scope of the present invention which is to be limited only by the claims appended hereto.

What is claimed is:

1. A method for fabricating a semiconductor device comprising:

providing a substrate comprising an upper layer of material;

forming a hardmask stack on the upper layer of material, the hardmask stack comprising an amorphous carbon portion formed in contact with the layer of material, and a capping layer formed on the amorphous carbon portion, the amorphous carbon portion comprising alternating layers of doped amorphous carbon containing dopant for enhancing etch selectivity with respect to said upper layer of material, and undoped amorphous carbon containing essentially none of said dopant;

forming a photoresist mask over the hardmask stack; and etching the hardmask stack using the photoresist mask as an initial etch mask to form a hardmask for patterning said upper layer of material.

2. The method claimed in claim 1, further comprising patterning said upper layer of material and removing the hardmask.

3. The method claimed in claim 2, wherein the hardmask is removed by an ashing process.

4. The method claimed in claim 1, wherein the amorphous carbon portion of the photoresist hardmask stack comprises:

a lowermost layer of undoped amorphous carbon formed on said layer of material;

an uppermost layer of undoped amorphous carbon formed in contact with said capping layer; and at least one layer of doped amorphous carbon between said uppermost and lowermost layers of undoped amorphous carbon.

5. The method claimed in claim 4, wherein the amorphous carbon portion of the photoresist hardmask stack comprises:

at least two layers of doped amorphous carbon between said uppermost and lowermost layers of undoped amorphous carbon; and at least one layer of undoped amorphous carbon between said at least two layers of doped amorphous carbon.

6. The method claimed in claim 1, wherein said doped and undoped layers of amorphous carbon comprise discrete layers.

7. The method claimed in claim 1, wherein said doped and undoped layers of amorphous carbon comprise continuous layers.

8. The method claimed in claim 1, wherein forming said photoresist mask comprises:

forming a photoresist pattern on said capping layer; and trimming said photoresist pattern.

9. The method claimed in claim 1, wherein said doped amorphous carbon is doped with nitrogen.

10. The method claimed in claim 1, wherein said substrate comprises a semiconductor substrate, and wherein said upper layer of material is a gate conductive material formed over a gate insulating material formed on said substrate.

11. A method for fabricating a semiconductor device comprising:

providing a substrate comprising an upper layer of material;

forming a hardmask stack on the upper layer of material, the hardmask stack comprising alternating layers of capping material and amorphous carbon including at least an upper capping material layer and a lower capping material layer, and at least one amorphous carbon layer formed between the upper and lower capping material layers;

forming a photoresist mask over the hardmask stack; and etching the hardmask stack using the photoresist mask as an initial etch mask to form a hardmask for patterning said upper layer of material.

12. The method claimed in claim 11, further comprising patterning said upper layer of material and removing the hardmask.

13. The method claimed in claim 11, wherein the hardmask stack further comprises a lower amorphous carbon layer formed on said upper layer of material, said lower capping material layer being formed on said lower amorphous carbon layer.

14. The method claimed in claim 13, further comprising removing the hardmask from said upper layer of material by an ashing process.

15. The method claimed in claim 13, wherein said lower amorphous carbon layer contains dopant for enhancing etch selectivity with respect to said upper layer of material.

16. The method claimed in claim 15, wherein said dopant is nitrogen.

17. The method claimed in claim 11, wherein forming said photoresist mask comprises:

forming a photoresist pattern on said hardmask stack; and trimming said photoresist pattern.

18. The method claimed in claim 11, wherein said substrate comprises a semiconductor substrate, and wherein said upper layer of material is a gate conductive material formed on a gate insulating material formed on said substrate.

* * * * *